(12) United States Patent
Lostoski et al.

(10) Patent No.: US 6,425,770 B1
(45) Date of Patent: *Jul. 30, 2002

(54) INPUT/OUTPUT DEVICE HAVING REMOVABLE MODULE

(75) Inventors: Douglas A. Lostoski, Richfield; David S. Wehrle, Chesterland; Gail R. Ball, Euclid, all of OH (US)

(73) Assignee: Rockwell Automation Technologies, Inc., Mayfield Heights, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/550,037

(22) Filed: Apr. 14, 2000

(51) Int. Cl.⁷ ................................................. H01R 12/00
(52) U.S. Cl. ...................... 439/76.1; 439/82; 439/532; 439/716; 361/759
(58) Field of Search ............................... 439/76.1, 532, 439/716, 82; 361/759

(56) References Cited

U.S. PATENT DOCUMENTS

| | | | |
|---|---|---|---|
| 4,956,747 A | 9/1990 | Beer et al. | 361/392 |
| 5,641,313 A | 6/1997 | Hohorst | 439/709 |
| 5,716,241 A | 2/1998 | Hennemann et al. | 439/716 |
| 5,775,955 A | 7/1998 | Graube et al. | 439/717 |
| 5,791,916 A | 8/1998 | Schirbl et al. | 439/76.1 |
| 5,984,734 A | 11/1999 | Piper et al. | 439/717 |
| 6,172,877 B1 * | 1/2001 | Feye-Homann et al. | 361/759 |

* cited by examiner

Primary Examiner—Tho D. Ta
Assistant Examiner—Truc Nguyen
(74) Attorney, Agent, or Firm—William R. Walbrun; Alexander M. Gerasimow; R. Scott Speroff

(57) ABSTRACT

An input/output device (10) includes housings (12, 120) defining a circuit board receiving cavity (25). An input/output module 160 is removably connected to the housings (12, 120). Circuit board (102) is engaged within the circuit board receiving cavity (25) and has power and data terminals (40, 60) electrically engaged therewith. Each of the power and data terminals (40, 60) have portions extending from the circuit board (102) and are adapted for being electrically engaged with complementary portions of terminals of adjacent devices in a stacked arrangement.

10 Claims, 10 Drawing Sheets

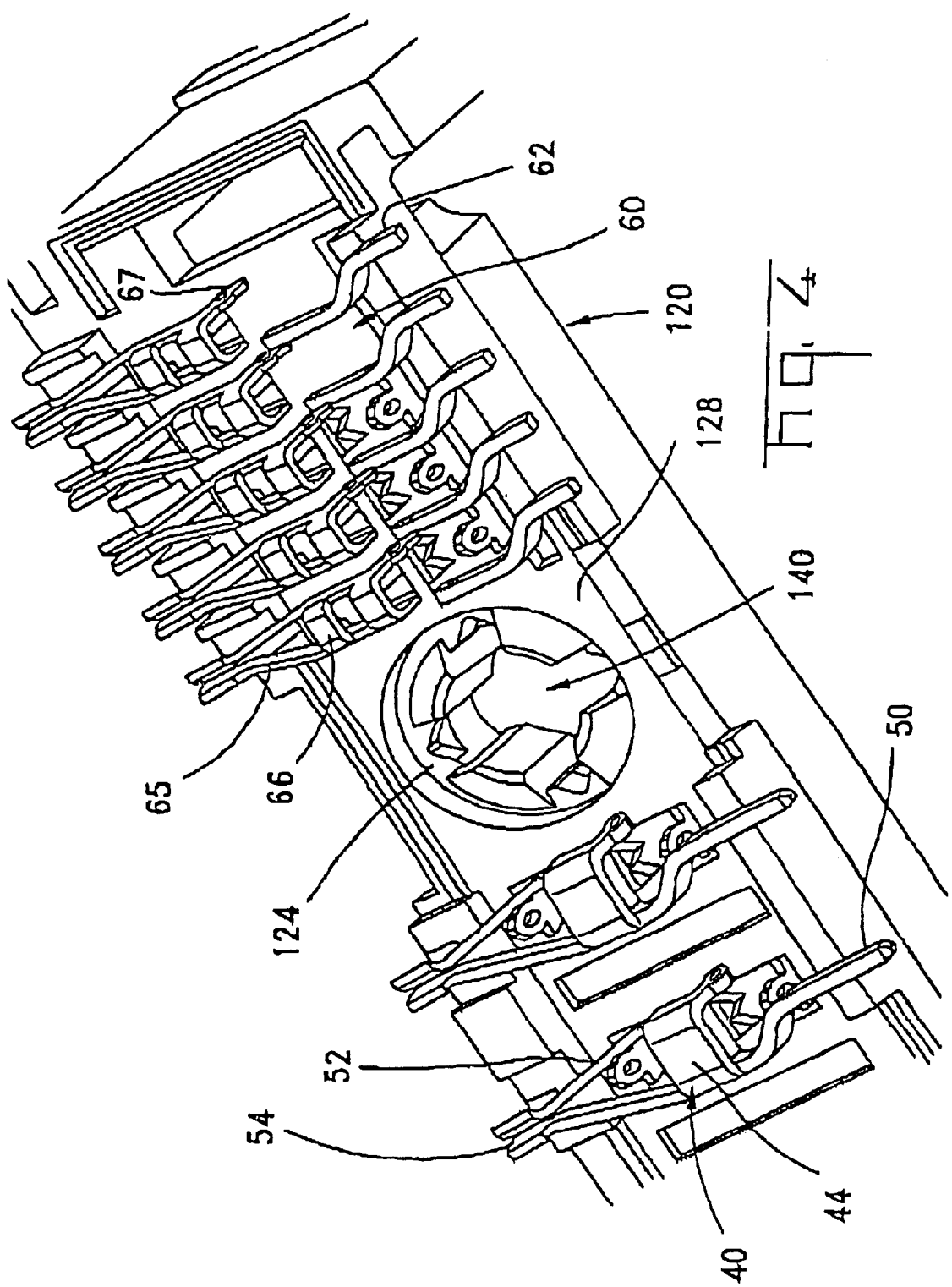

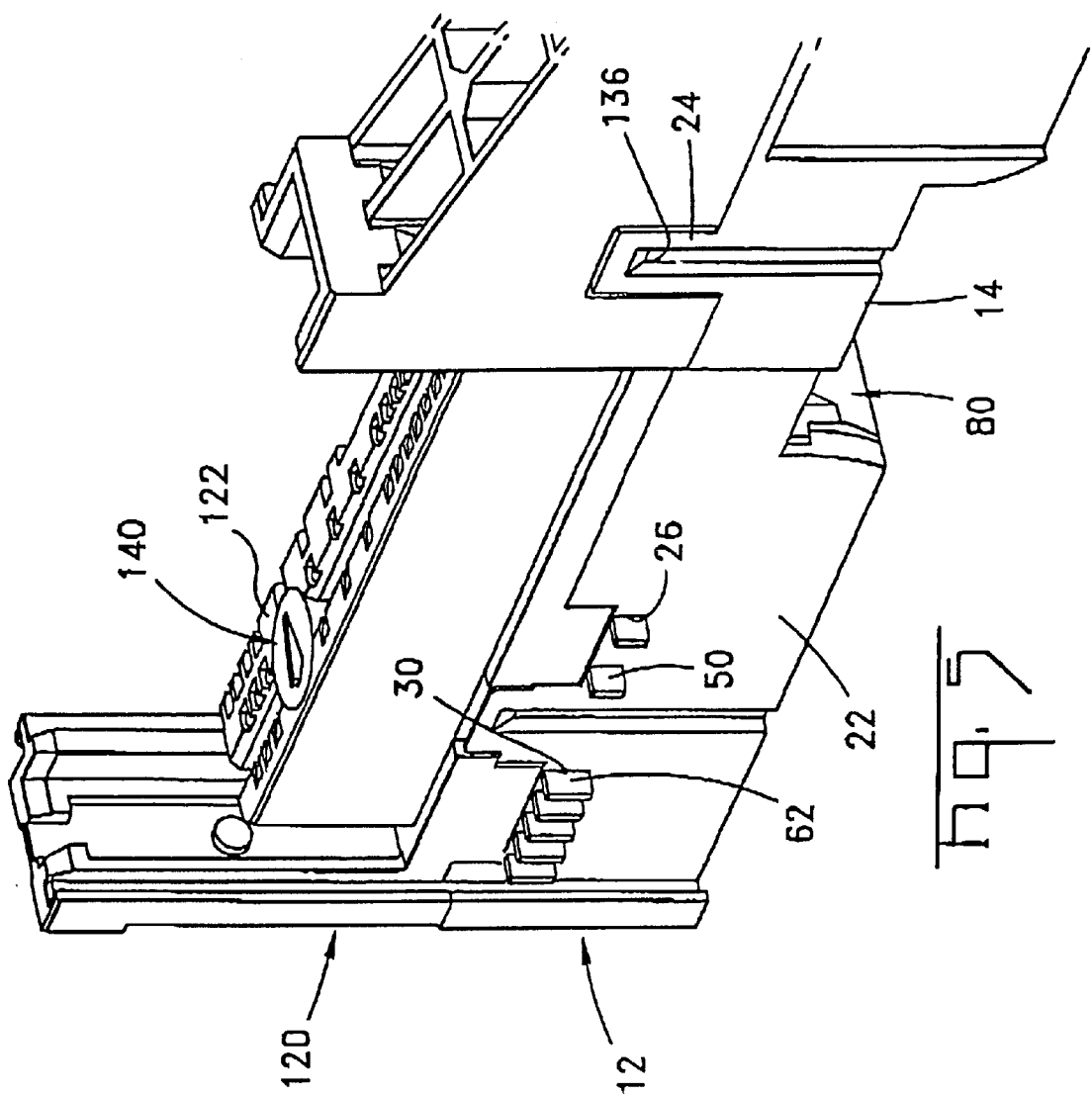

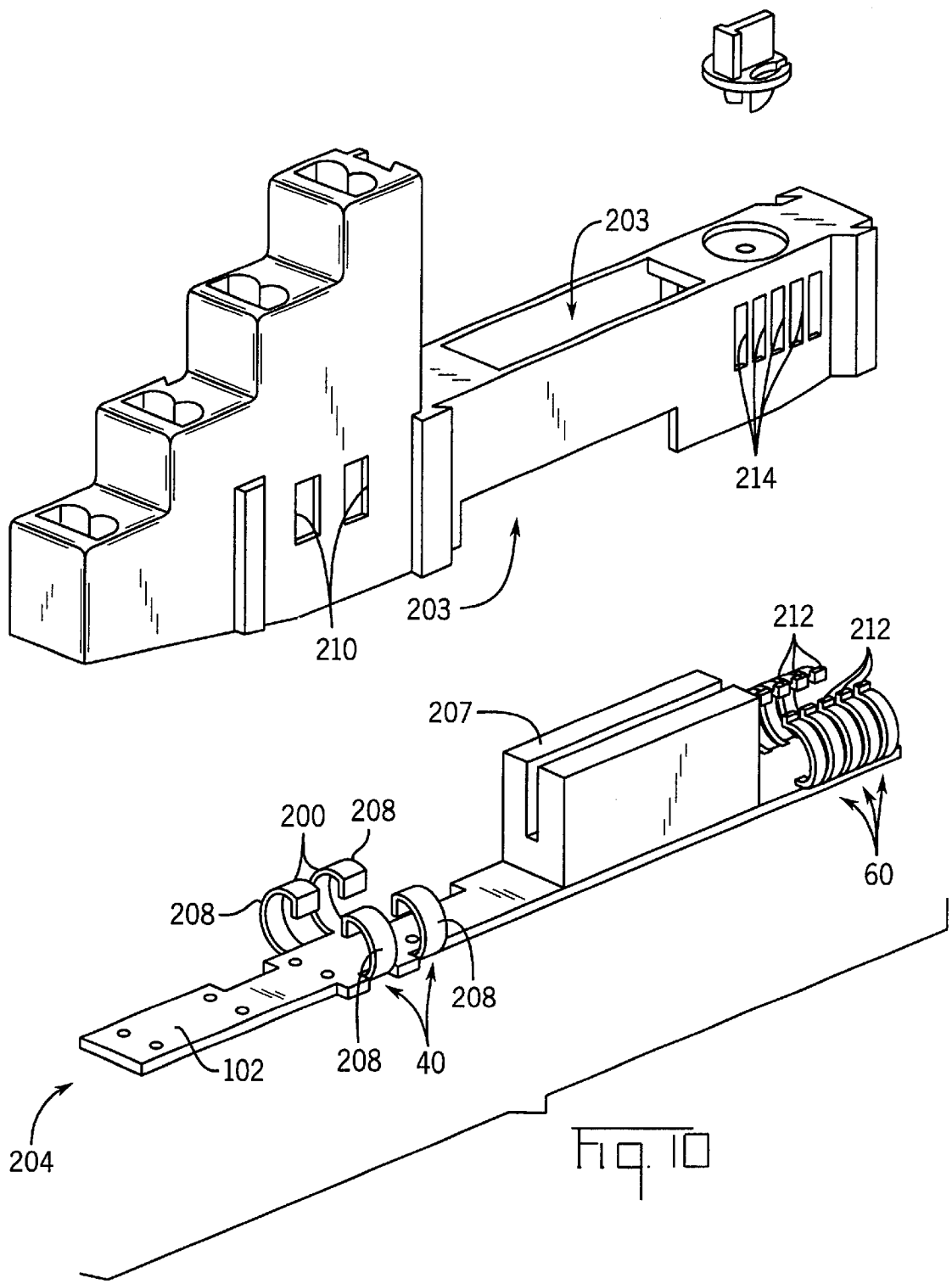

INPUT/OUTPUT DEVICE HAVING REMOVABLE MODULE

TECHNICAL FIELD

This invention is related to input/output devices and more particularly to electrical terminals that are used to interconnect adjacent modules in an input/output device.

BACKGROUND ART

It is well known in the art to use a plurality of electronic input/output modules that fit together in a stacked arrangement and are electrically connected together. It is also known that the modules may be mounted to a U-shaped metal rail that supports the device and provides electrical connection to ground.

U.S. Pat. No. 5,775,955 discloses one such arrangement in which each module has plug-compatible male and female connectors that are electrically engaged by sliding a loose module along a rail and into engagement with modules that are fixed to the rail. To repair or replace a selected module in the stacked arrangement, it is necessary to slide and remove all the modules to one side of the selected module from the rail before the selected module can be removed, repaired or replaced. The whole process is then repeated to remount all the modules. This process can cause excessive wear on components that may engage the rail as well as take time. It is desirable, therefore, to have a module that can be removed and remounted to a rail without disturbing the other modules on the rail.

U.S. Pat. No. 4,956,747 discloses modules having base portions with spring contacts extending from one side to the other of each base portion. The forces generated by the spring contacts as they are compressed by engagement with terminals in adjacent modules act in a direction parallel to the rail and in a direction to push the modules apart, thus requiring the use of interlocking housing portions or the like to assure the modules remain together. Additionally, as more modules are added, the amount of force builds up. It is desirable, therefore, to have terminals that interconnect adjacent modules in which the forces are "self-contained", that is do not act to push the modules apart and do not build up as the number of modules on the rail are increased.

U.S. Pat. No. 5,719,241 discloses modules that can be mounted to the rail in a direction orthogonal to the rail. The modules use flat bar-like power bridging members and terminals having resilient spring arms for interconnecting adjacent modules.

DISCLOSURE OF INVENTION

The present invention is directed to an electrical terminal usable in input/output modules mounted to rails that overcomes problems associated with the prior art. The terminal is suitable for use as both a power and/or a data terminal in such a module. For purposes of illustration, the terminal will be shown as a power terminal in an input/output module. It is to be understood that the terminal is not limited to use in such a module.

The electrical terminal for interconnecting electronic modules in a stacked arrangement includes a U-shaped body having first, second and third connecting portions. The body has a base and opposed legs extending to free ends adapted to be electrically connected to circuits of a circuit board and defining the first connecting portion. A blade contact extends outwardly from one of the legs intermediate the base and free end and in a direction substantially perpendicular to the first connecting portion. The blade contact defines the second connecting portion. A receptacle contact extends outwardly from at least one of the legs intermediate the base and free end and in a direction substantially perpendicular to the first connecting portion and opposite to that of the blade contact. The receptacle contact defines the third connecting portion. Upon disposing the terminal in a terminal receiving passageway of a module with the first connecting portion electrically engaged to a circuit board therein and the second and third connecting portions being proximate openings in the passageway on opposite sides of the module, the second and third connecting sections are available for being mated with complementary connecting portions of adjacent modules in a stacked arrangement.

In the embodiment shown, the receptacle contact is a pair of spring arms, with one arm extending from each of the legs of the U-shaped body. The leading end of the blade contact is offset from the leg such that the blade contact is in alignment with the space between the spring arms such that the terminal is hermaphroditic.

The invention is also directed to an electronic module having at least one of the above terminals disposed therein.

An embodiment of the invention will now be described by way of example with reference to the accompanying drawings.

BRIEF DESCRIPTION OF THE DRAWINGS

FIG. 3 is an isometric view of an electrical terminal used in the assembly of FIG. 1.

FIG. 4 is an isometric view illustrating the position of a plurality of the terminals in the assembly with the circuit board being removed for purposes of illustration.

FIG. 5 is an isometric view of a fragmentary portion of the module illustrating the position of the power and data terminals along one side of the module.

FIG. 10 is an isometric exploded view illustrating the alternate terminals of FIG. 9.

BEST MODES FOR CARRYING OUT THE INVENTION

Figure 1:
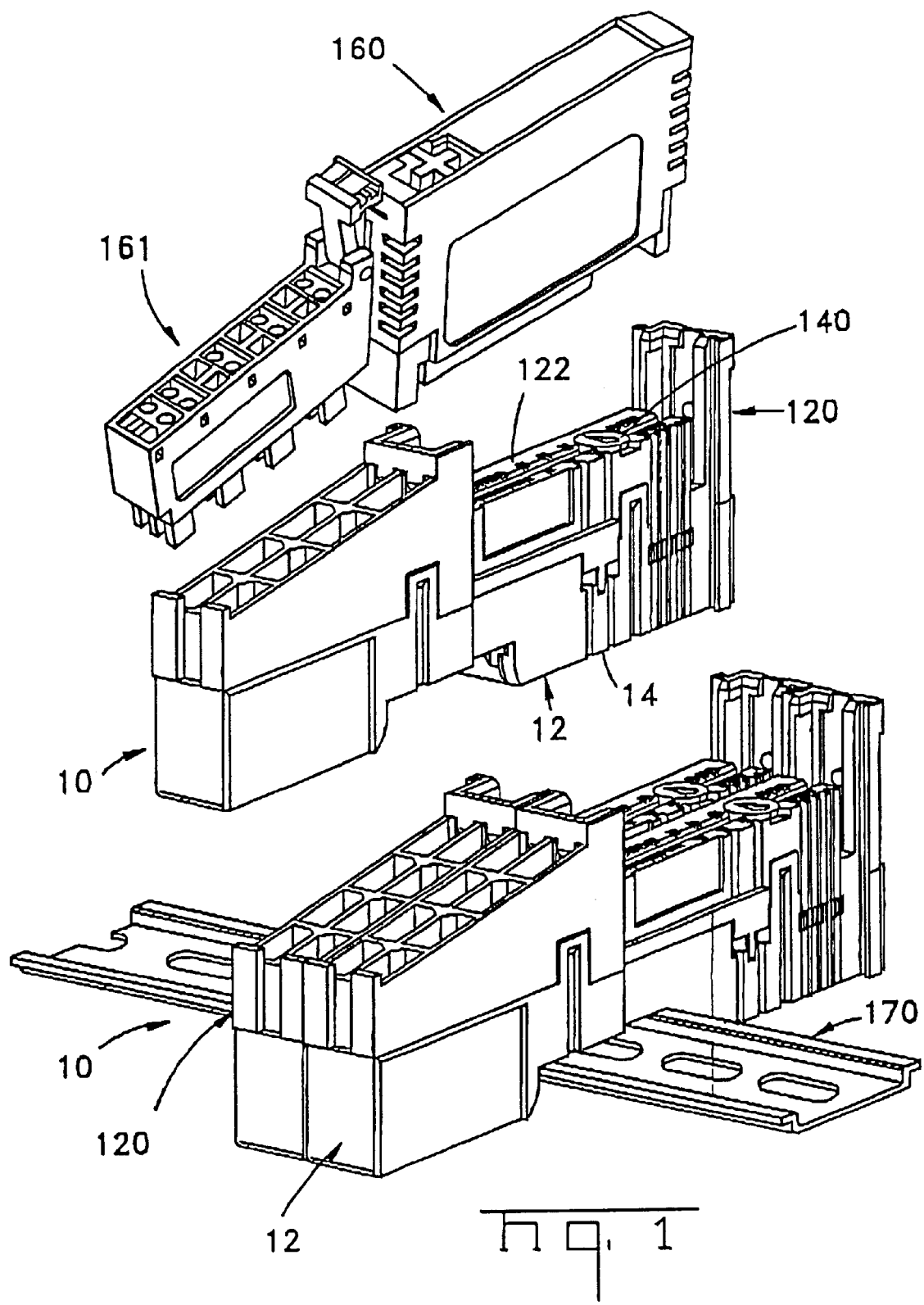
FIG. 1 is an isometric partially exploded view of an electronic system using the modular connector assembly of the present invention and illustrating two complementary mating connectors for one of the modules.

In FIG. 1 two modules, each identified as a connector assembly 10 of the present invention, are shown mounted to a rail 170 of an electronic device. A third connector assembly 10 is shown exploded from the rail 170. Two complementary mating connectors 160, 161 are exploded from the third assembly 10.

Figure 2:
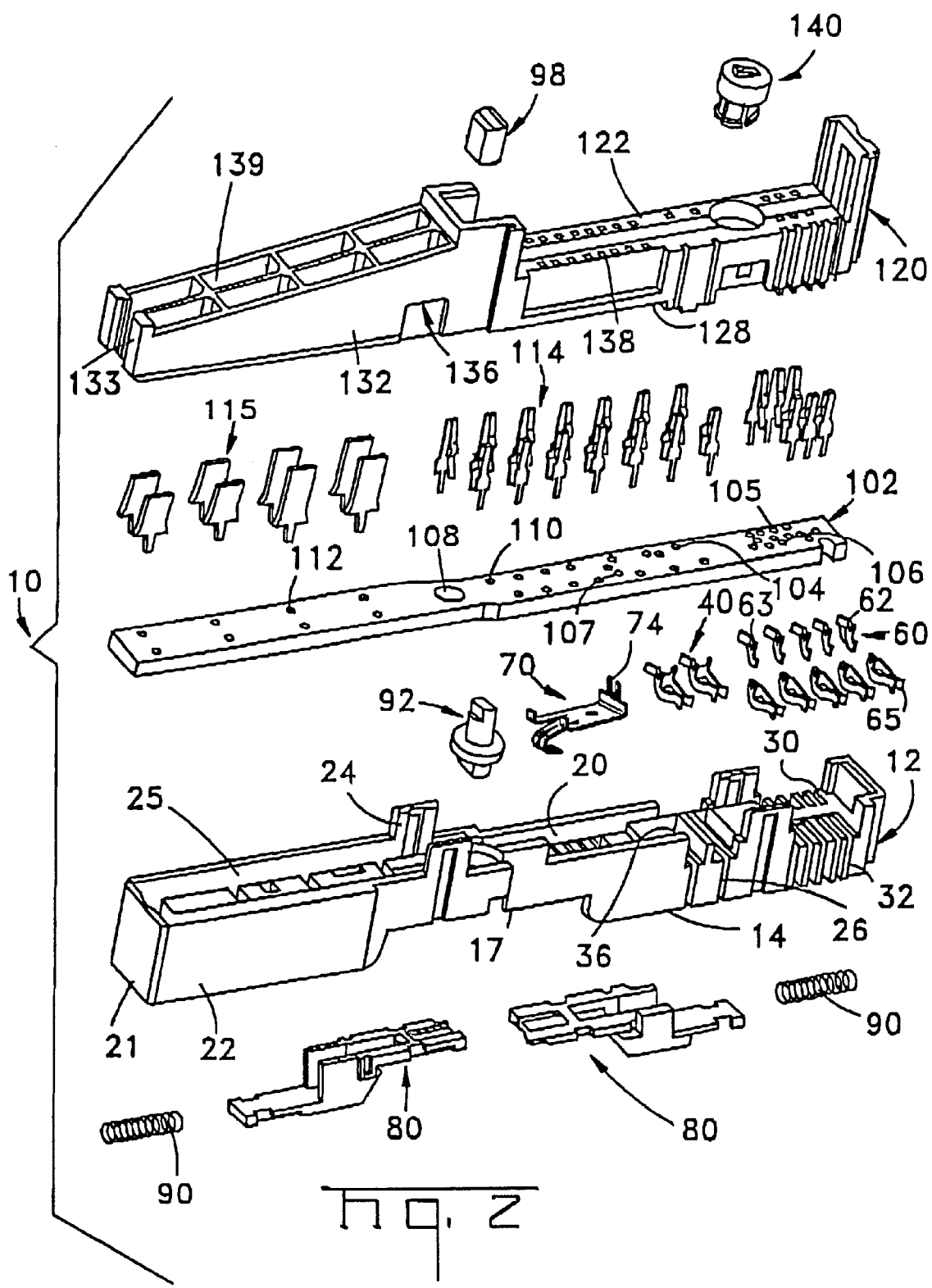
FIG. 2 is an isometric exploded view of one of the connector assembly modules of FIG. 1.

Referring now, to FIGS. 1 and 2, connector assembly 10 includes a lower housing 12 having a plurality of terminals 40, 60 and 70 disposed therein; an upper housing 120 securable to the lower housing 12 and having a plurality of terminals 114, 116 disposed therein and a circuit board 102 disposed between and within the housings 12, 120. Lower housing 12 has a rail mounting face 14 including a rail engaging recess 17, an assembly face 20, end walls 21, and side walls 22 having latch arms 24 extending upwardly therefrom and adapted to engage cooperating latch surfaces 136 on upper housing 120. End walls 21 and side walls 22 and assembly face 20 together define a circuit board receiving cavity 25 adapted to receive circuit board 102 therein. Housing 12 includes power terminal receiving passageways 26, data contact receiving cavities 30, 32 and ground terminal receiving cavity 36 for receiving respective power terminals 40, data terminal portions 62, 65, and ground terminal 70. Lower housing 12 further includes a pair of spring loaded rail engaging clamps 80 mounted to rail mounting face 14. Clamps 80 cooperate with springs 90 to hold connector assembly 10 on the rail 170, assembly 10 being released from the rail 170 by turning an actuator having lower portion 92 and upper portion 98.

Upper housing 120 has a mating face 122, an assembly face 128 and opposed side walls 132 having latch surfaces 136 adapted to receive latch arms 24 to hold the two housings 12, 120 together. Housing 120 further includes terminal receiving cavities 138 and 139 for receiving respective terminals 114 and 116 therein. Upper housing 120 further includes the upper portion 98 of the actuator and a programmable key-receiving member 140 that cooperates with a key protrusion (not shown) on mating housing 160.

As can best be seen in FIG. 2, power terminals 40, data terminals 60 including blade sections 62 and compliant arm sections 65, and ground terminal 70 are adapted to be mounted to one side of circuit board 102 and terminals 114 and 116 are adapted to be mounted to the other side of circuit board 102. The terminals may be mounted using complaint sections or solder tails that are received in apertures of board 102 to be electrically connected to circuits of the board. It is to be understood that the terminals may also be surface mounted to board 102 by means known in the art.

Figure 6:
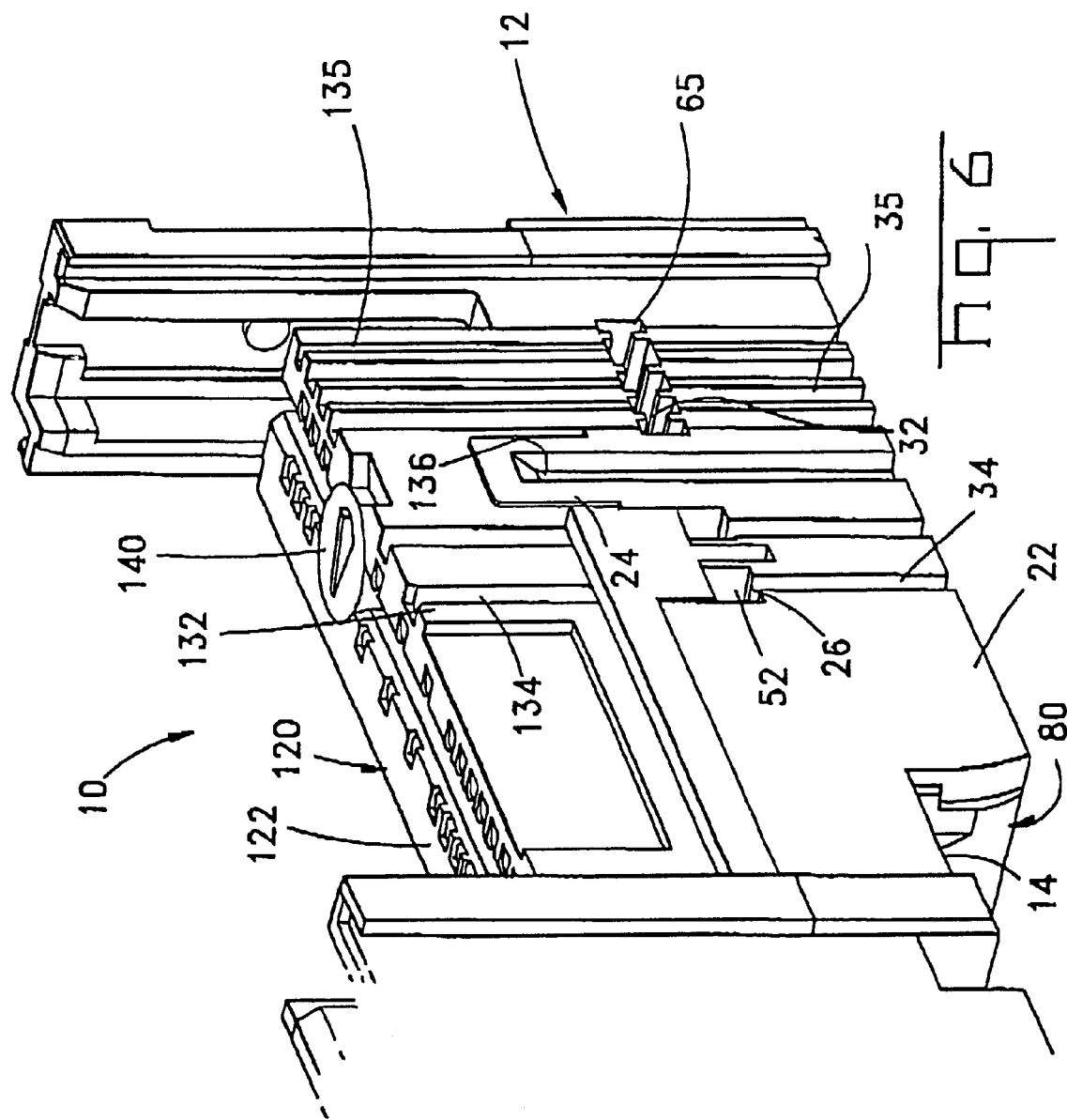
FIG. 6 is a view similar to that of FIG. 5 illustrating the position of the power and data terminals along the other side of the module.
Figure 7:
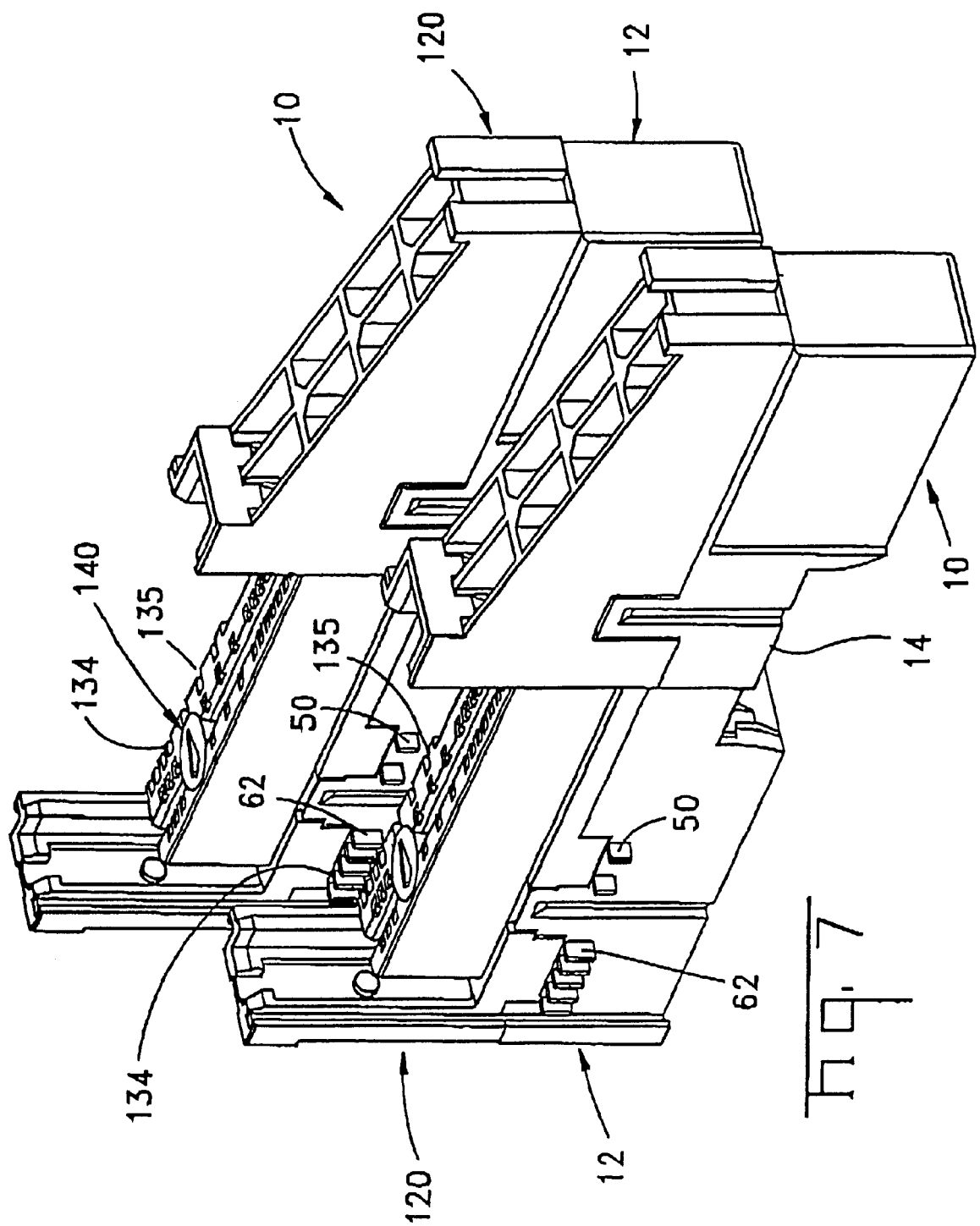

Referring now to FIGS. 3 through 6, each power or bus terminal 40 includes a U-shaped body 42 having a base 44 and opposed legs 46 extending to free ends 48 having compliant sections therein for electrically and mechanically engaging respective apertures 104 in circuit board 102, shown in FIG. 2. Terminal 40 includes a blade contact 50 extending transversely outwardly in one direction from one of the legs 46 and an arm 52 extending transversely outwardly in the opposite direction from each leg 46 and defining a blade-receiving contact section 54 therebetween, as best seen in FIG. 3. FIG. 4 illustrates the position of the power terminals 40 with respect to assembly face 128 of upper housing 120. For purposes of clarity, circuit board 102 is not shown between terminals 40 and assembly face 128. This Figure also illustrates that blade 50 has been configured to be aligned with a center axis of terminal 40 that extends between arms 52 and legs 46 and along the leading end of blade 50. Terminal 40 is, therefore, hermaphroditic. Upon positioning power terminals 40 within their respective passageways 26, the blade contacts 50 extend outwardly from the side wall 22 and the leading ends of arms 52 are recessed within respective passageways 26, as best seen in FIGS. 5 and 6.

Data terminals 60 can be made substantially in the same manner as power terminals 40 with blade contact 62 and arms 65. In the embodiment shown, however, the data terminals 60 are formed as two separate sections with blade contacts 62 including a pair of compliant board mounting sections 63 (shown in FIG. 2) and arms 65 extending from a U-shaped body 66 having compliant board mounting sections 67. The two sections are connected electrically through the circuit board 102. Upon positioning data terminals 60 within their respective cavities 30, 32, the blade contacts 62 extend outwardly from the side wall 22 and the leading ends of arms 65 are recessed from the wall surface, as seen in FIGS. 5 and 6. Data terminals 60 are also shown in FIG. 4.

Referring again to FIG. 2, one method of assembling connector assembly module 10 is to first dispose terminals 114 and 116 in respective cavities 138, 139 of upper housing 120. A circuit board subassembly can then be assembled by mounting the ground terminal 70, power terminals 40 and data terminals 60 in respective apertures 107, 104, 105 and 106 on the under side of circuit board 102. The upper side of the circuit board subassembly can then be disposed on the board mounting sections of terminals 114 and 116. The lower housing 12 having springs 90, rail engaging clamps 80 and lower actuator portion 92 disposed therein can then be secured to the upper housing and board subassembly. In the assembled connector lower actuator portion 92 extends through opening 108 of circuit board 102 and into the upper housing 120. Lastly, the upper actuator portion 98 and the key receiving member 140 are inserted into respective apertures in the upper housing 132.

Figure 7:
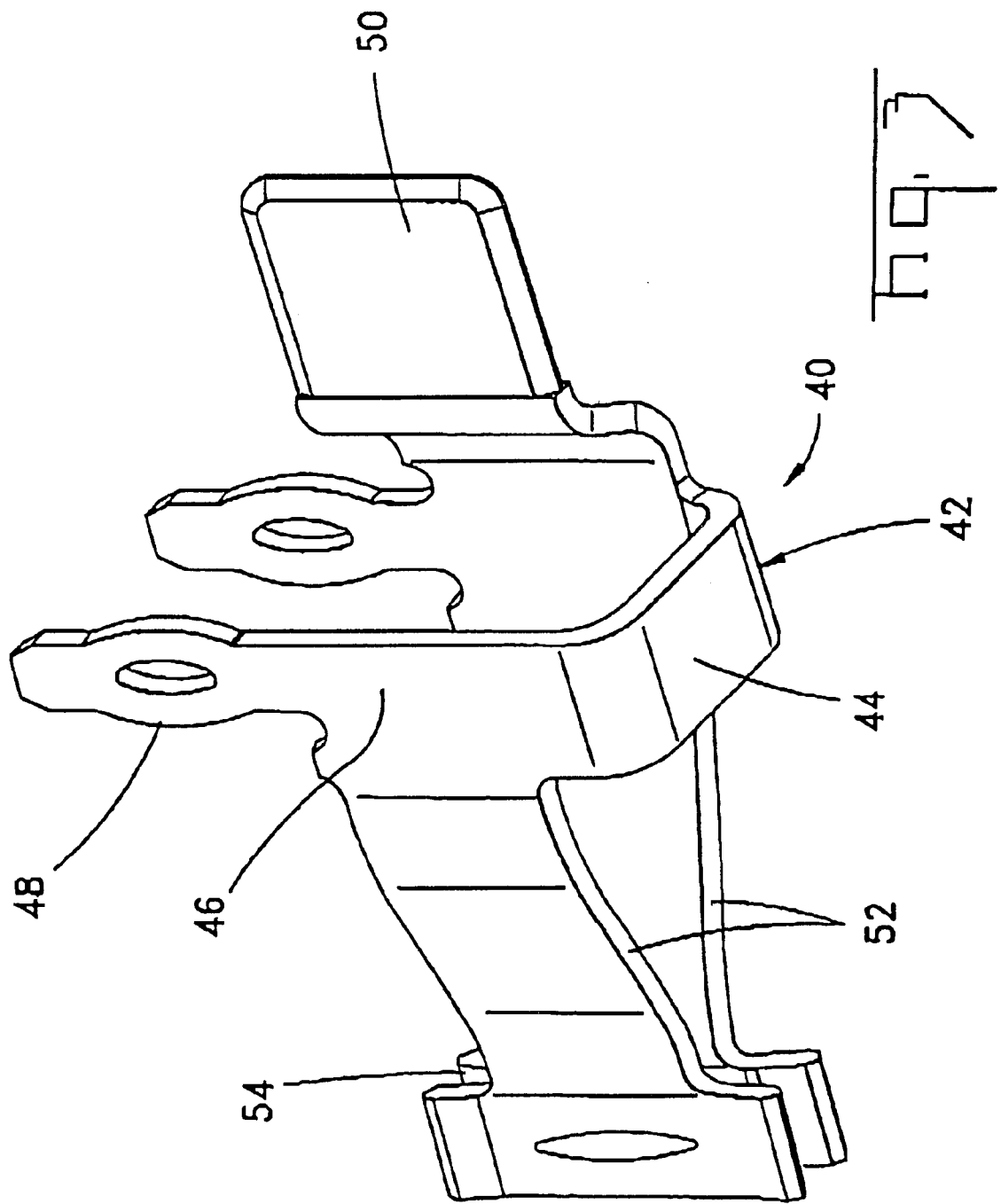
FIG. 7 is an isometric view of two modules that are being electrically connected together in a stacked arrangement.
Figure 8:
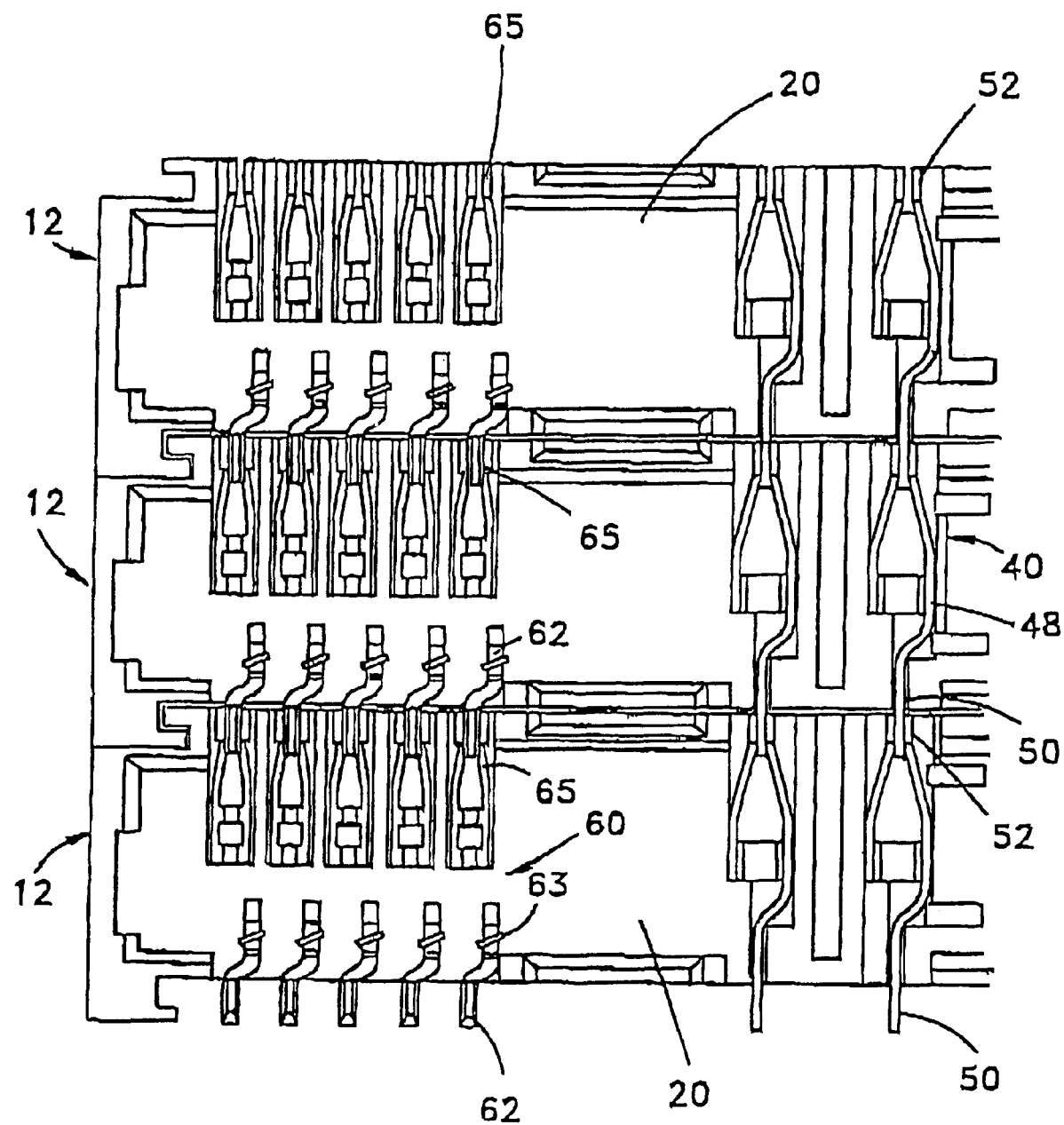
FIG. 8 is a plan sectional view of a fragmentary portion of a plurality of connectors illustrating the mated power and data terminals.

FIGS. 6 through 8 illustrate how adjacent connector assemblies 10 are stacked and the respective power and data terminals 40, 60 are mated to corresponding terminals of the adjacent module. FIG. 6 shows that the leading ends of the respective arms 52, 65 are recessed from the surface of side wall 22 and are in communication with cooperating slots 35, 135 and 34, 134 in lower and upper housings 12, 120. As two modules 10 are brought into engagement, as shown in FIG. 7, the respective blade contacts 50, 62 are aligned with slots 134, 135 in upper housing 120 and are moved into engagement between respective arm contact sections 54, 65 as the modules 10 are moved together in a vertical direction with respect to the rail 170, shown in FIG. 1. FIG. 8 illustrates a sectional view of the connector assembly 10 showing the terminals 40, 60 in lower housings 12 of three interconnected modules and the electrical engagement therebetween.

The present invention provides an electrical terminal that enables vertical assembly of the modules being stacked as well as enables easy replacement of designated modules. The terminal provides reliable electrical interconnection between the stacked modules. The forces generated by the mated spring arms and blades are "self contained" within the module. The forces are generated in a direction that is perpendicular to the longitudinal axis of the rail and, therefore, do not act to move the adjacent modules apart. Additionally the forces are generated perpendicular to the direction of mounting the modules to the rail and mating the corresponding contacts and, therefore, do not react to push the modules from the rail. The design of the terminal is suitable for carrying power and/or signals, the size of the terminal and the kind and thickness of metal stock being selected in accordance with the desired current carrying capability as known in the art. The terminal, furthermore, is hermaphroditic, thereby eliminating the need to manufacture different terminals for each side of the module. The terminal facilitates both adding and removing of modules from an electronic device, because the remaining modules can remain in place when one module is removed for repair or replacement.

Figure 9:
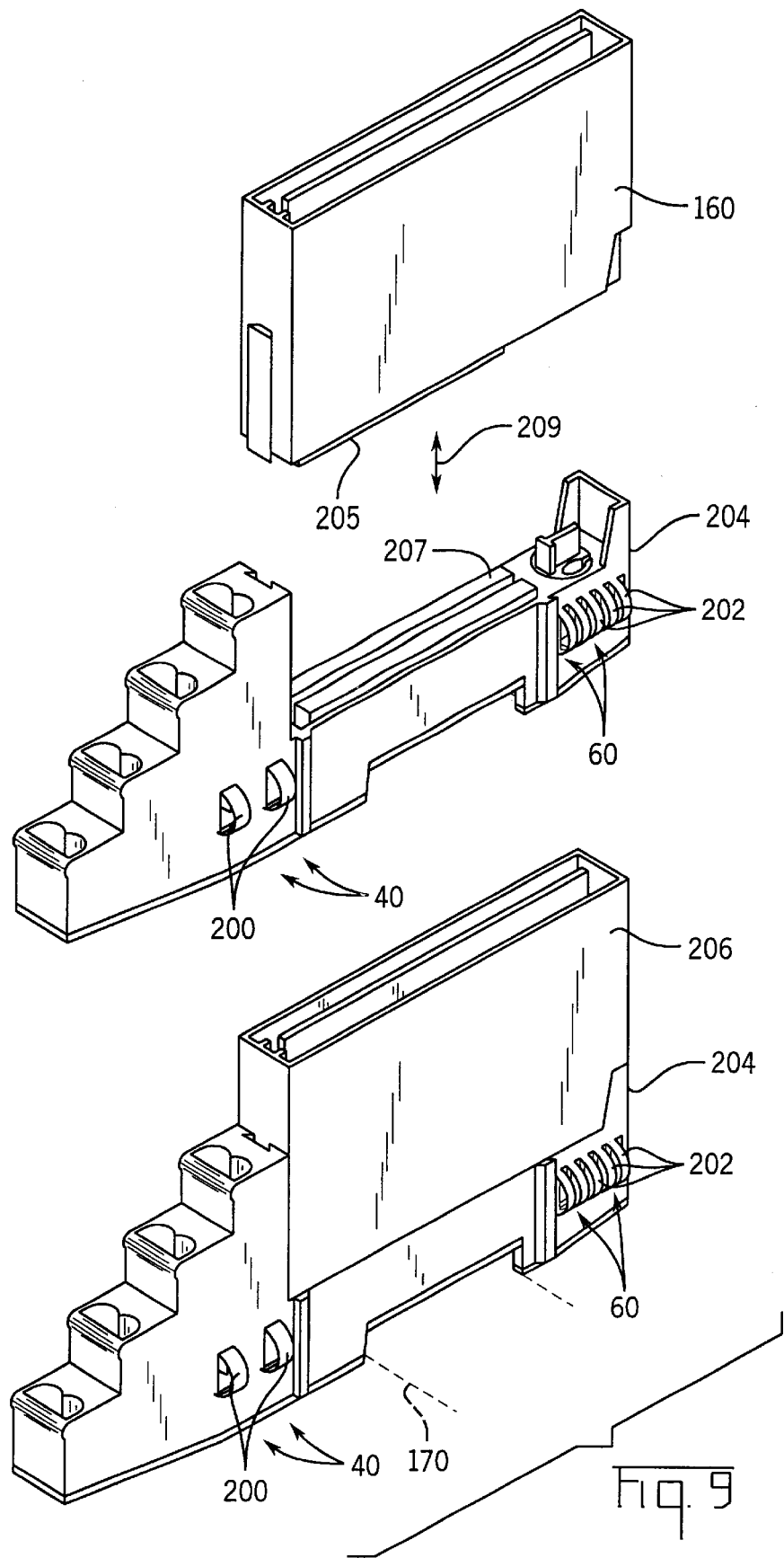
FIG. 9 is an isometric view of a pair of alternate connector assembly modules in which one of the modules is shown in exploded form.

In FIGS. 9 and 10, an alternate embodiment of power terminals 40 and data terminals 60 is illustrated. In this embodiment, power terminals 40 comprise spring contacts 200, and data terminals 60 comprise similar spring contacts 202. Unlike the hermaphroditic terminals described above, spring contacts 200 and 202 rely on laterally biased spring characteristics of each terminal to maintain appropriate contact with the corresponding terminal of a next adjacent module.

In FIG. 9, two modular connector assemblies are illustrated. Each assembly includes a terminal housing portion 204 with spring contacts 200, 202 and a removable complimentary mating input/output module or magazine 160. The assemblies can be positioned adjacent one another, as described with reference to FIG. 1, so that the spring bias of spring contacts 200 and 202 maintain an electrical connection between corresponding power terminals and data terminals of the connector assemblies.

Referring generally to FIG. 10, one exemplary embodiment of spring contacts 200 and 202 is best illustrated. Each spring contact 200, 202 is connected to printed circuit board 102 that is housed within a circuit board cavity 203 defined by side walls of housing 204. Power terminal spring contacts 200 each include a pair of laterally biased portions 208 that extend laterally outward from terminal housing 204. For example, terminal housing 204 may include corresponding passageways or openings 210 through which lateral portions 208 extend when printed circuit board 102 is assembled into housing 204.

Similarly, data terminal spring contacts 202 are electrically connected to printed circuit board 102 and include laterally extending contact portions 212. Portions 212 also are designed to extend laterally from housing 204. For example, housing 204 may include corresponding passageways or openings 214 through which laterally extending portions 212 extend.

Similar to FIG. 1, the input/output module 160 of FIGS. 9 and 10 includes a card-edge 205 for removable electrical connection with a card-edge connector or module connector 207 of conventional design. The module 160 can be inserted and removed in a vertical direction indicated by arrow 209. The module connector 207 is electrically connected to the circuit board 102 and provides a similar function to that performed by terminals 114 of FIG. 2.

The spring bias of portions 208 and 212 ensure appropriate electrical contact between corresponding power terminals as well as corresponding data terminals. For example, when adjacent connector assemblies are mounted along a DIN rail 170, electrical connection is maintained by the abutting terminals. The spring contacts provide an alternative terminal to the insertable, hermaphroditic terminals described in the embodiment illustrated in FIGS. 1–8.

It is thought that the electrical terminal of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. An input/output device comprising:
    a housing having side walls defining a circuit board receiving cavity;
    an input/output module removably connected to the housing; and
    a circuit board engaged within the circuit board receiving cavity, the circuit board having power and data terminals electrically engaged therewith, each of the power and data terminals having portions extending from the circuit board and adapted for being electrically engaged with complementary portions of terminals of adjacent devices in a stacked arrangement, the circuit board being removably and electrically connected to the input/output module, the input/output module being generally vertically disposed and positioned perpendicular to the horizontal plane defined by the circuit board.

2. The input/output device of claim 1, wherein the housing is adapted to be mounted to a rail in a stacked arrangement with adjacent input/output devices of similar design.

3. The input/output device of claim 2, wherein the circuit board is elongated and extends perpendicular to the rail.

4. An input/output device adapted to be electrically connected to adjacent devices in a stacked side-by-side arrangement comprising:
    a housing defining a circuit board receiving cavity, the housing having opposing first and second sides, each of the opposing first and second sides having power terminal receiving passageways and data terminal receiving passageways;
    a circuit board engaged within the circuit board receiving cavity, the circuit board having power and data terminals electrically engaged therewith, each of the power and data terminals having portions extending from the circuit board positioned proximate to corresponding power terminal receiving passageways and data terminal receiving passageways and adapted for being electrically engaged with complementary portions of terminals of adjacent devices in a stacked side-by-side arrangement; and
    an input/output module removably and electrically connected to the circuit board, the input/output module being generally vertically disposed and positioned perpendicular to the horizontal plane defined by the circuit board.

5. The input/output device of claim 4, wherein the circuit board has a module connector secured thereto for electrically connecting the input/output module to the circuit board.

6. The input/output device of claim 5, wherein the circuit board is elongated and extends substantially the length of the housing, the power and data terminals and module connector being connected to the circuit board in a spaced apart side-by-side relation to one another along the circuit board with bottom portions of the power and data terminals and module connector lying within a common plane defined by the circuit board.

7. The input/output device of claim 4, wherein the housing has a programmable key-receiving member positioned on the housing for engagement between the housing and the input/output module.

8. An input/output device comprising:
    a housing;
    a circuit board housed within the housing, the circuit board having terminals electrically engaged therewith, each of the terminals having portions extending from the circuit board and adapted for being electrically engaged with complementary portions of terminals of adjacent devices in a stacked arrangement, the circuit board lying in a substantially horizontal plane; and
    an input/output module removably and electrically connected to the circuit board, the input/output module being generally vertically disposed and positioned perpendicular to the horizontal plane defined by the circuit board.

9. The input/output device of claim 8, wherein the housing is adapted to be mounted to a rail in a stacked arrangement with adjacent input/output devices of similar design.

10. The input/output device of claim 9, wherein the circuit board is elongated and extends perpendicular to the rail.

* * * * *